United States Patent [19]
Moden

[11] Patent Number: 5,943,557
[45] Date of Patent: Aug. 24, 1999

[54] METHOD AND STRUCTURE FOR ATTACHING A SEMICONDUCTOR DIE TO A LEAD FRAME

[75] Inventor: Walter L. Moden, Meridian, Id.

[73] Assignee: Micron Technology, Inc., Boise, Id.

[21] Appl. No.: 08/719,224

[22] Filed: Sep. 25, 1996

[51] Int. Cl.$^6$ .................................................. H01L 21/44
[52] U.S. Cl. ........................ 438/118; 438/119; 438/123
[58] Field of Search ................................... 438/118, 119, 438/123

[56] References Cited

U.S. PATENT DOCUMENTS

| | | | |
|---|---|---|---|
| 5,140,404 | 8/1992 | Fogal et al. ................................. | 357/70 |
| 5,177,032 | 1/1993 | Fogal et al. ............................... | 437/220 |
| 5,218,229 | 6/1993 | Farnworth ................................. | 257/676 |
| 5,256,598 | 10/1993 | Farnworth et al. ....................... | 437/220 |
| 5,286,679 | 2/1994 | Farnworth et al. ....................... | 438/118 |
| 5,304,842 | 4/1994 | Farnworth et al. ....................... | 257/668 |
| 5,477,008 | 12/1995 | Pasqualoni et al. .................... | 174/52.3 |
| 5,548,091 | 8/1996 | DiStefano et al. ....................... | 174/260 |

*Primary Examiner*—Kevin M. Picardat

[57] ABSTRACT

A semiconductor assembly comprises a semiconductor die having a circuit side with circuitry thereon, a lead frame, and an attachment structure for securing the die to the lead frame. The attachment structure comprises a carrier, an adhesive interposed between the carrier and the lead frame which attaches the carrier to the lead frame, and a paste interposed between the carrier and the circuit side of the die which attaches the carrier to the die. A method for attaching a semiconductor device to a lead frame comprises the steps of providing an attachment structure comprising a carrier having first and second sides and an adhesive on the first side of the carrier, the carrier attached to a lead frame by the adhesive. Next, a paste is dispensed on the second side of the carrier. A surface of the semiconductor die including circuitry is then contacted with the paste and the paste is cured.

16 Claims, 2 Drawing Sheets

METHOD AND STRUCTURE FOR ATTACHING A SEMICONDUCTOR DIE TO A LEAD FRAME

FIELD OF THE INVENTION

This invention relates to the field of semiconductor manufacture, and more particularly to a method for attaching a semiconductor die to a lead frame.

BACKGROUND OF THE INVENTION

During one process to manufacture a semiconductor device, an electrically conductive adhesive such as epoxy paste or metal is placed on a paddle of a lead frame. A back side of a semiconductor die having a front (circuit) side with bond pads and back side opposite the front side is adhered to the paddle of a lead frame with the conductive material. Other materials used to attach a die to a paddle include conductive and nonconductive materials such as epoxy film, epoxy film on tape, glue, and thermoset and/or thermoplastic-coated polyimide.

Other attachments of a die to a lead frame are described in U.S. Pat. Nos. 5,140,404 and 5,177,032 by Fogal, et al.; U.S. Pat. No. 5,218,229 by Farnworth; and U.S. Pat. Nos. 5,256,598 and 5,304,842 by Farnworth et al.; each of which is assigned to Micron Technology, Inc. and incorporated herein by reference.

Another semiconductor assembly is a leads-over-chip (LOC) assembly. In one typical leads-over-chip (LOC) application, a polyimide carrier material is manufactured having a thermoset epoxy adhesive or a polyimide-type adhesive coated on either side. The carrier is interposed between the lead frame and a circuit side of the semiconductor die, then the adhesive is cured with heat thereby securing the die to the lead frame.

During shipment of the lead frame from the manufacturer to the user the manufacturer secures fingers and leads of the lead frame to ensure they are not bent during shipping. The fingers and leads are secured with a lead lock tape which is left in place during device processing. The lead lock tape conventionally comprises a polyimide carrier film which is a lower grade material compared to the LOC adhesive tape carrier film, and is less expensive. The lead lock tape is coated on one side with a butyl rubber thermoset adhesive which secures the tape to the lead frame and prevents the leads from moving or bending during shipping.

Current LOC assemblies have various problems. For example, the nonconductive adhesive attachment between the die and the lead frame is relatively expensive because of the cost of the thermoplastic polyimide adhesive which must be coated on both sides of the carrier film. Further, a dedicated tape dispensing tool and a heating block are required which add expense and manufacturing steps to the manufacturing process. The thermoplastic which attaches the die and the lead frame to the carrier requires relatively high melt temperatures, for example in the range of 300° C. to 450° C. which stresses the die and the circuitry thereon. Thermoset tapes require somewhat lower temperatures, for example in the range of from about 200° C. to 300° C.

A method and structure for die attach which has advantages over current methods and structures would be desirable.

SUMMARY OF THE INVENTION

The present invention provides a new method and structure for manufacturing a leads-over-chip (LOC) semiconductor assembly. One embodiment of the invention comprises the use of an LOC lead frame, a semiconductor die having a circuit side, a carrier material with first and second sides, and a nonconductive epoxy paste. The carrier may be a carrier material used with conventional LOC tape, or can also be lead lock tape. In any case, the first side of the carrier is attached to the lead frame and the epoxy paste is dispensed onto the second side of the carrier. The side of the die having bond pads is contacted with epoxy paste, and the paste is then cured thereby attaching the die to the lead frame.

Various objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENTS

Figure 1:
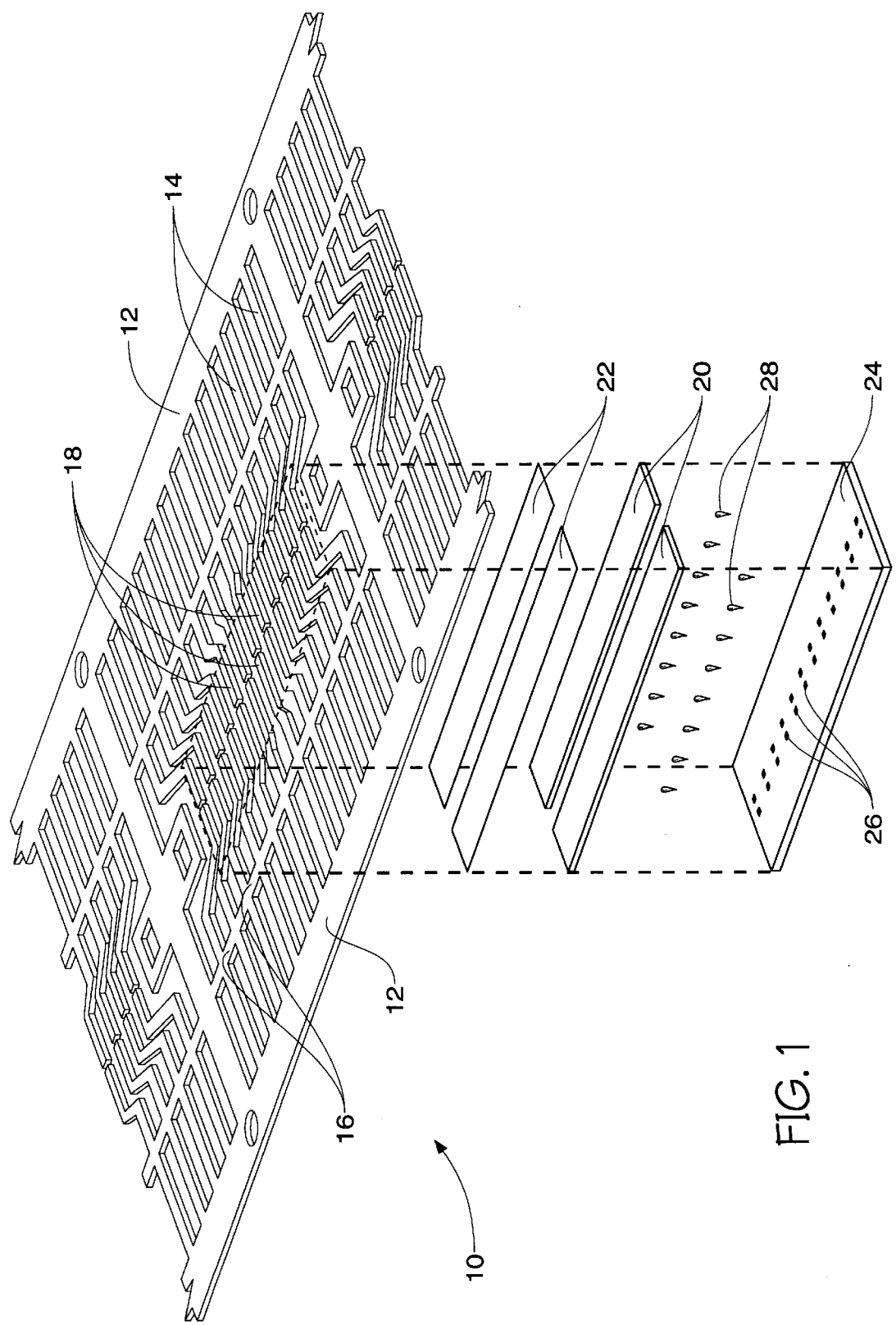
FIG. 1 is an exploded depiction of one embodiment of an inventive semiconductor assembly.
Figure 2:
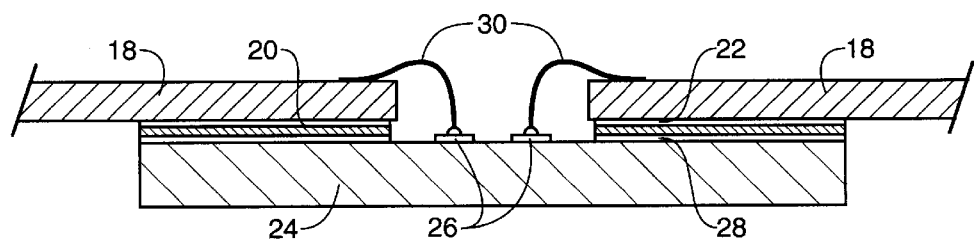
FIG. 2 is a cross section of the assembled device of FIG. 1 before encapsulation and wire bond.

FIG. 1 is an exploded view depicting one embodiment of an in-process semiconductor assembly, and FIG. 2 shows the device of FIG. 1 after assembly. In this embodiment, a lead frame 10 comprises rails 12, leads 14, dam bars 16, and lead fingers 18. A carrier material 20 is attached on a first side to the lead frame 10 with a first adhesive 22 such as thermoset, thermoplastic, or other adhesive. A second side of carrier 20 is attached to a semiconductor die 24 having a circuit side with circuitry such as bond pads 26 thereon. Die 24 is secured to said lead frame with an uncured paste, such as a nonconductive epoxy paste, maleimide, cynate ester, polyimide, siloxane, or other polymer resin-based adhesive. The paste is interposed between the carrier 20 and the circuit side of the die 24 thereby attaching the carrier to the die and the die to the lead frame.

Carrier 20 is depicted in two sections extending in spaced, parallel relation such that bond pads 26 are exposed after assembly of the semiconductor device to allow connection of bond wires 30 to bond pads 26 and to lead fingers 18. Carrier material 20 can comprise any number of materials. Conventional LOC carrier such as Kapton™ polyimide available from E.I. DuPont de Nemours would function adequately. Lead lock tape such as R722 available from Tomagawa Corp. of Japan would also function sufficiently as the carrier material, and may have advantages as described below. Lead lock tape is not conventionally used for die attach as the adhesive is a more brittle, higher stress adhesive than LOC die attach adhesive tape. Lead lock tape is also less expensive and a low stress material is not needed on the lead frame side.

Adhesive 22 can comprise thermoplastic, thermoset, any number of resins, or any material which has adequate adhesive and chemical properties to firmly attach the carrier and the die to the lead frame without corroding the lead frame or damaging the semiconductor die. Adhesive 22 is applied to carrier 20 according to any means known in the art such as by spraying, typically before securing the carrier to the lead frame.

Paste 28, such as a nonconductive epoxy paste, is dispensed onto the semiconductor die, or preferably onto the second side of carrier 20. It can be dispensed by a print head, by syringe using a multineedle head, using write dispensing, using stamp pad transfer, or by any suitable means. A quantity of paste sufficient to provide a thickness of 0.3 mils to 1.2 mils after attachment of the die would be sufficient, although other thickness may function adequately based on the type of adhesive used, the size of the die, the surface area to which the paste is applied, etc. Nonconductive epoxies, such as 77-2LTC produced by Abelstick of Rancho Dominguez, Calif. or other such adhesives would function adequately. Generally, the paste used should be electrically nonconductive, be curable to ensure adhesion of the die to the carrier and thus to the lead frame, offer low stress to function as a buffer coat between the lead lock tape and the surface of the die, and provide sufficient cohesion to hold the die until a cure/gel step.

Next, the circuit side of the die and the paste are contacted. The die can be positioned with surface mounting equipment such as pick-and-place equipment.

Figure 3:
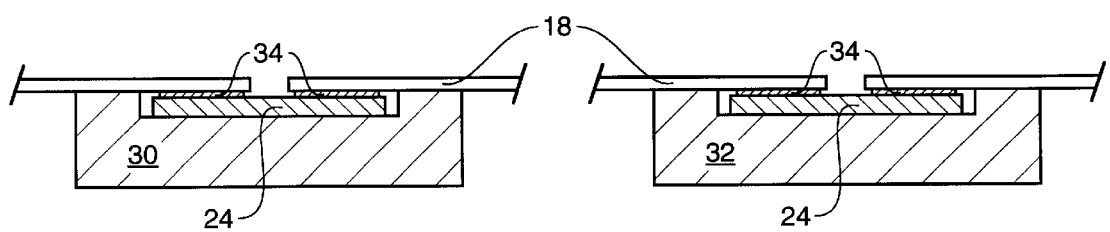
FIG. 3 depicts a series of hot plates used to cure an adhesive in one particular embodiment of the invention.

Any number of techniques can be used to cure the nonconductive epoxy paste. In a first embodiment, the paste is quickly cured (snap cured) in a cure oven for from about 5 seconds up to 2 minutes depending on the temperature and the material used. With the snap cure process, the lead frame is stepped across a series of hot plates or a heat block having a temperature of from about 100° C. to about 250° C. which heats and cures the paste. FIG. 3 shows first 30 and second 32 heat blocks for curing attachment material 34 which attaches die 24 to lead frame 18. Snap curing and the use of hot plates are also described in U.S. Pat. No. 5,477,008, issued Dec. 12, 1995 to Pasqualoni et al. and U.S. Pat. No. 5,548,091, issued Aug. 20, 1996 to DiStefano et al., each of which is incorporated herein by reference.

In another embodiment, the paste may reach its cure temperature during a later wire bonding step to fully cure the paste depending on the dwell time at the wire bonder. As the paste such as nonconductive epoxy cures at lower temperatures than thermoset or thermoplastic, less stress is imparted to the die than with attachment means requiring higher temperatures.

In another cure embodiment an intermediate gel process is used which only partially cures the paste. When the paste is gelled, the adhesive is cured sufficiently to tack the die to the carrier so the assembly can generally be handled without dislodging the die from the carrier unless undue force is applied between the die and the lead frame. The gel step can be performed in an oven or on a hot plate at a temperature in the range of from about 150° C. to about 350° C. for one second. This gel process increases the number of materials which would function sufficiently as it eliminates the requirement of the uncured paste having to secure the die to the lead frame during handing and transportation to a cure oven. Subsequent to gelling the paste, the paste is fully cured later in the manufacturing process.

Other embodiments of the invention include using a liquid material such as a liquid nonconductive epoxy rather than the paste described. A cure step, for example including heat, ultraviolet light, or other cure methods depending on the adhesive, would be required immediately after contacting the die to the carrier if the assembly is to be moved unsupported. For example, an adhesive curable with ultraviolet "A" (UVA) light includes XUF-592-2 available from Zymet of E. Hanover, N.J. This material can be cured by exposure to UVA light at about 1000 to about 1500 milliwatts/cm$^2$ for about 15 seconds.

Further, using lead lock tape for the carrier in place of the LOC die attach tape may have advantages. Lead lock tape is typically applied to the leads and lead fingers of the lead frame to prevent the structures from being bent or otherwise damaged during subsequent processing. With one inventive method of manufacturing a semiconductor device, a lead frame is manufactured and a carrier material such as lead lock tape is attached to the lead frame using thermoset, thermoplastic, or another workable material. Next, the lead frame and carrier material attached thereto are shipped to a semiconductor device supplier who then dispenses an epoxy paste onto the carrier. Finally, the semiconductor device is attached to the lead frame using the epoxy paste. This saves the semiconductor device supplier the steps of assembling an LOC tape onto the lead frame, and the lead lock tape is less expensive than conventional LOC tape. Dispensing the paste onto the carrier (or in an alternate embodiment onto the die) can be done with conventional semiconductor assembly equipment, and dedicated tape dispensing tool and a heating block are not required.

It is preferable to attach the bond wires to the lead frame and to the bond pads after curing the adhesive, although it may be possible to attach the bond wires prior to curing the adhesive, or as a step during the wire bonding process as described above.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. Any mucilaginous adhesive (mucilage), from the liquid material to the paste as described, would function adequately for the practice of the invention. It is therefore contemplated that the appended claims will cover any such modifications or embodiments as fall within the true scope of the invention.

What is claimed is:

1. An in-process semiconductor assembly comprising:
    a semiconductor die having a circuit side;
    a lead frame;
    an attachment structure securing said die to said lead frame, said attachment structure comprising a carrier, a solidified first adhesive contacting both of said carrier and said lead frame and attaching said carrier to said lead frame, and an uncured second adhesive interposed between said carrier and said circuit side of said die which attaches said carrier to said die, wherein said second adhesive is a material selected from the group consisting of epoxy paste, cynate ester, siloxane, and polymer resin-based adhesives.

2. The assembly of claim 1 wherein said first adhesive is a material selected from the group consisting of thermoset and thermoplastic.

3. The assembly of claim 1 wherein said second adhesive is nonconductive.

4. A method for attaching a semiconductor device to a lead frame, comprising the steps of:
    providing a carrier having first and second sides and a solidified first adhesive on said first side of said carrier which contacts said carrier and a lead frame, wherein said carrier is attached to said lead frame by said solidified first adhesive;

subsequent to said step of providing said carrier and said first adhesive, dispensing an unsolidified second adhesive on said second side of said carrier;

contacting a surface of a semiconductor die with said second adhesive, said surface having contacts thereon;

subsequent to said step of contacting said semiconductor die surface with said second adhesive, curing said second adhesive.

5. The method according claim 4 wherein said second adhesive is epoxy, further comprising the step of gelling said epoxy prior to said step of curing said epoxy.

6. The method of claim 5 wherein said first adhesive is a material selected from the group consisting of thermoset and thermoplastic.

7. A method of attaching a semiconductor die to a lead frame comprising the steps of:

providing a semiconductor die having a circuit side and a back side opposite said circuit side;

providing a carrier having first and second sides with an adhesive material selected from the group consisting of thermoset and thermoplastic on said first side;

providing a lead frame;

contacting said lead frame and said carrier with said adhesive material on said first side of said carrier then solidifying said adhesive material;

subsequent to said step of solidifying said adhesive material, dispensing an uncured epoxy paste on said second side of said carrier;

contacting said circuit side of said die and said carrier with said epoxy paste on said second side of said carrier;

curing said epoxy paste.

8. The method of claim 7 wherein said epoxy paste is applied to said carrier from above.

9. The method of claim 7 wherein said epoxy paste is applied to said carrier from below.

10. The method of claim 7 wherein said curing of said epoxy paste is a snap cure.

11. The method of claim 7 further comprising the step of gelling said epoxy before said step of curing said epoxy paste.

12. A method of manufacturing a semiconductor device, comprising the following steps:

manufacturing a lead frame;

attaching a carrier material to said lead frame using a material selected from the group consisting of thermoset adhesive and thermoplastic adhesive;

shipping said lead frame and said carrier material attached thereto to a semiconductor device supplier;

at said semiconductor device supplier, dispensing an epoxy paste onto said carrier;

attaching a semiconductor device to said lead frame using said epoxy paste.

13. The method of claim 12 wherein said epoxy is generally nonconductive.

14. The method of claim 12 further comprising the step of curing said epoxy to secure said semiconductor device to said lead frame.

15. The method of claim 14 wherein said epoxy cure comprises gelling said epoxy.

16. The method of claim 14 wherein said epoxy cure comprises snap curing said epoxy.

* * * * *